United States Patent [19]

Gregerson et al.

[11] Patent Number: 5,476,176

[45] Date of Patent: Dec. 19, 1995

[54] REINFORCED SEMICONDUCTOR WAFER HOLDER

[75] Inventors: Barry Gregerson; Boyd Wittman, both of Colorado Springs, Colo.

[73] Assignee: Empak, Inc., Chanhassen, Minn.

[21] Appl. No.: 247,887

[22] Filed: May 23, 1994

[51] Int. Cl.⁶ .................................................. B65D 85/30
[52] U.S. Cl. ........................... 206/711; 141/98; 206/454; 206/725; 211/41; 414/940
[58] Field of Search ...................................... 206/334, 454, 206/308.1; 211/41; 141/98; 414/217, 292, 940

[56] References Cited

U.S. PATENT DOCUMENTS

| | | |
|---|---|---|
| Re. 33,361 | 10/1990 | Coe . |
| 3,467,242 | 9/1969 | DeRousse . |
| 3,534,862 | 10/1970 | Shambelan . |
| 3,850,296 | 11/1974 | Hirata et al. . |
| 3,913,749 | 10/1975 | Wyers . |
| 3,918,756 | 11/1975 | Saville et al. . |
| 3,923,156 | 12/1975 | Wallestad . |
| 3,923,191 | 12/1975 | Johnson . |
| 3,926,305 | 12/1975 | Wallestad . |
| 3,939,973 | 2/1976 | Wallestad . |
| 3,961,877 | 6/1976 | Johnson . |
| 4,043,341 | 8/1977 | Johnson . |
| 4,061,228 | 12/1977 | Johnson . |
| 4,248,346 | 2/1981 | Johnson . |
| 4,450,960 | 5/1984 | Johnson . |
| 4,471,716 | 9/1984 | Milliren . |
| 4,493,418 | 1/1985 | Johnson . |
| 4,520,925 | 6/1985 | Johnson . |
| 4,532,970 | 8/1985 | Tullis et al. . |
| 4,534,389 | 8/1985 | Tullis . |
| 4,555,024 | 11/1985 | Voss et al. . |
| 4,557,382 | 12/1985 | Johnson . |
| 4,669,612 | 6/1987 | Mortensen . |
| 4,684,021 | 8/1987 | Niebling et al. . |
| 4,687,097 | 8/1987 | Mortensen . |
| 4,718,549 | 1/1988 | Rissotti et al. . |
| 4,718,552 | 1/1988 | Rossi et al. . |
| 4,721,207 | 1/1988 | Kikuchi . |
| 4,724,963 | 2/1988 | Mortensen . |
| 4,739,882 | 4/1988 | Parikh et al. . |
| 4,752,007 | 6/1988 | Rossi et al. . |
| 4,793,488 | 12/1988 | Mortensen . |
| 4,815,912 | 3/1989 | Maney et al. . |
| 4,817,795 | 4/1989 | Kos . |
| 4,817,799 | 4/1989 | Gregerson et al. . |
| 4,827,110 | 5/1989 | Rossi . |
| 4,833,306 | 5/1989 | Milbrett . |
| 4,872,554 | 10/1989 | Quernemoen . |
| 4,880,116 | 11/1989 | Kos . |
| 4,888,473 | 12/1989 | Rossi . |

(List continued on next page.)

FOREIGN PATENT DOCUMENTS

92/16964  10/1992  WIPO .

OTHER PUBLICATIONS

Slocum, Alexander H., "Sematech Short Course: Deterministic Machine Design Increasing Reliability and Performance", Precision Machine Design, Prentice Hall, Englewood Cliffs, 1992, pp. 49–64.

Primary Examiner—Bryon P. Gehman
Attorney, Agent, or Firm—Haugen and Nikolai

[57] ABSTRACT

An enclosed semiconductor wafer holder, and a cover providing isolation control of semiconductor wafers that is simple, lower cost, and non-obtrusive is described. The device includes a cover with a sealing perimeter that creates a hermetic seal when engaged with the semiconductor wafer holder. It also includes a purging means attached to the holder that allows an active gentle purging of inert gas into the sealed semiconductor wafer holder. The holder has contoured recess-forming pairs that do not effect semiconductor wafer transfer when the recess forming pairs are warped. The recess-forming pairs also have integrally corresponding ribs that help prevent warpage of the contoured recess-forming pairs during the plastic injection molding process.

10 Claims, 7 Drawing Sheets

U.S. PATENT DOCUMENTS

| | | | |
|---|---|---|---|
| 4,901,876 | 2/1990 | Box | 206/308.1 X |
| 4,930,634 | 6/1990 | Williams et al. | |
| 4,949,848 | 8/1990 | Kos . | |
| 4,966,284 | 10/1990 | Gregerson et al. | |
| 4,966,519 | 10/1990 | Davis et al. | |
| 4,995,430 | 2/1991 | Bonora et al. | |
| 5,024,329 | 6/1991 | Grohrock . | |
| 5,025,926 | 6/1991 | Gregerson et al. | |
| 5,046,615 | 9/1991 | Nentl et al. | |
| 5,111,936 | 5/1992 | Kos . | |
| 5,154,301 | 10/1992 | Kos . | |
| 5,184,723 | 2/1993 | Karl . | |
| 5,207,324 | 5/1993 | Kos . | |
| 5,217,053 | 6/1993 | Foster et al. | |
| 5,253,755 | 10/1993 | Maenke . | |
| 5,255,783 | 10/1993 | Goodman et al. | |
| 5,255,797 | 10/1993 | Kos . | |
| 5,273,159 | 12/1993 | Gregerson . | |

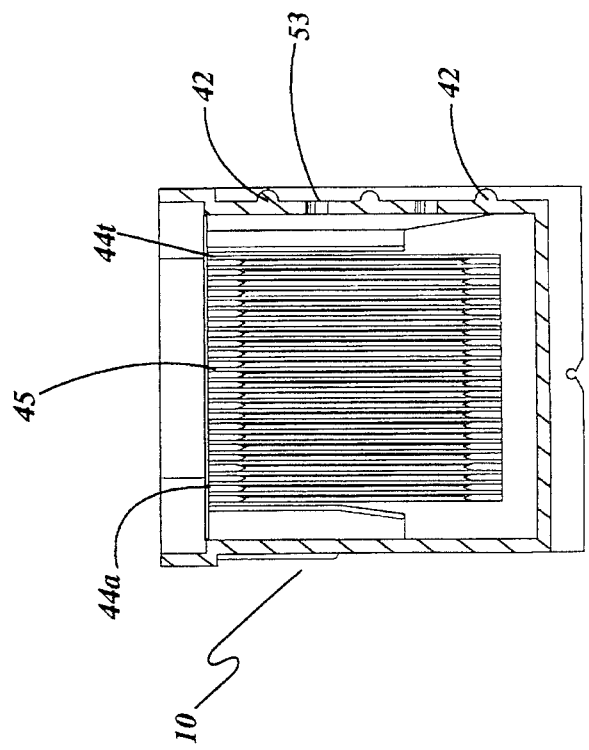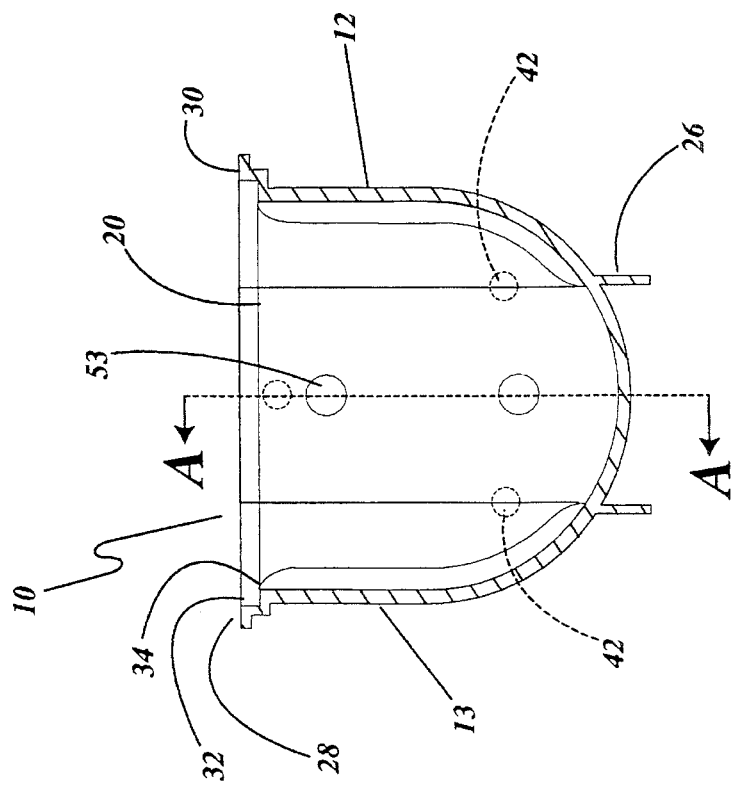

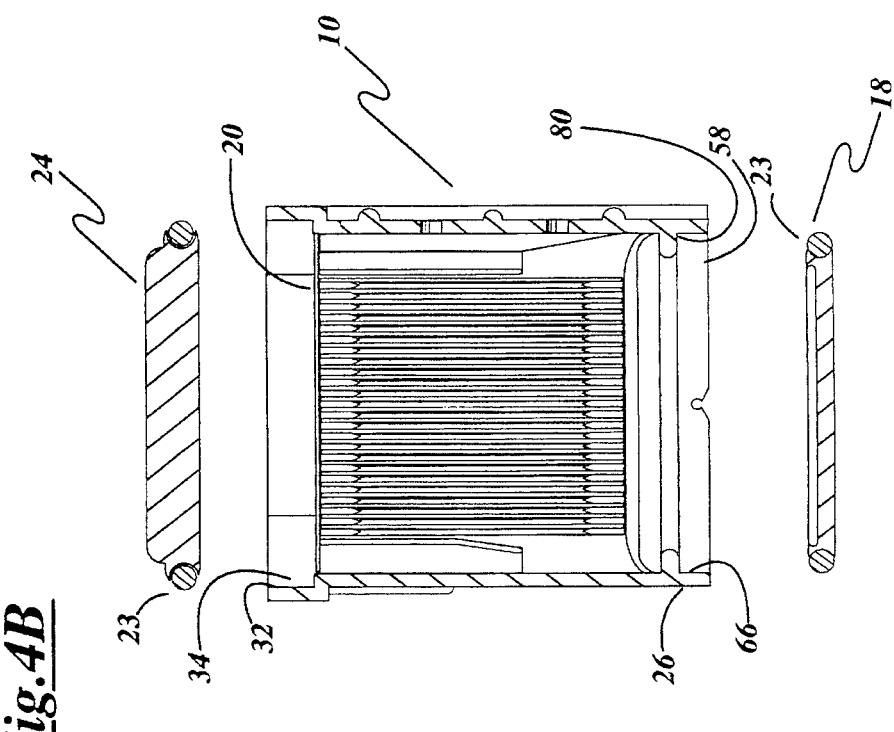
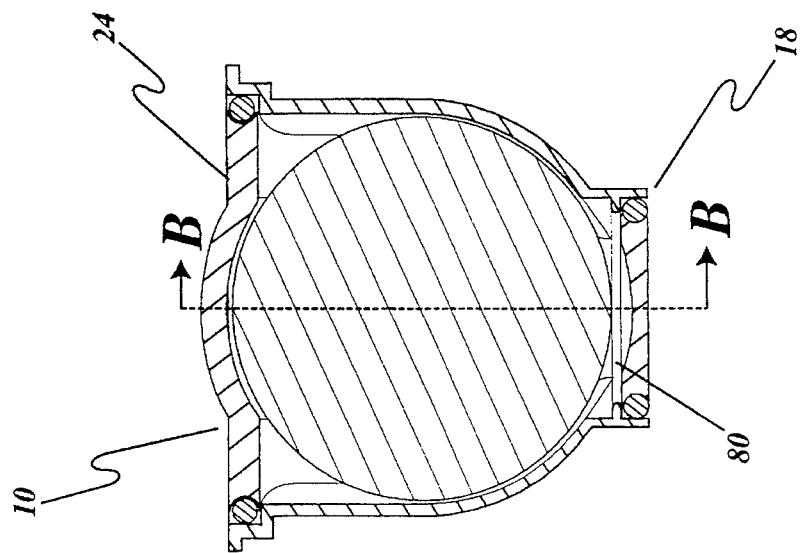
*Fig.4B*
*Fig.4*

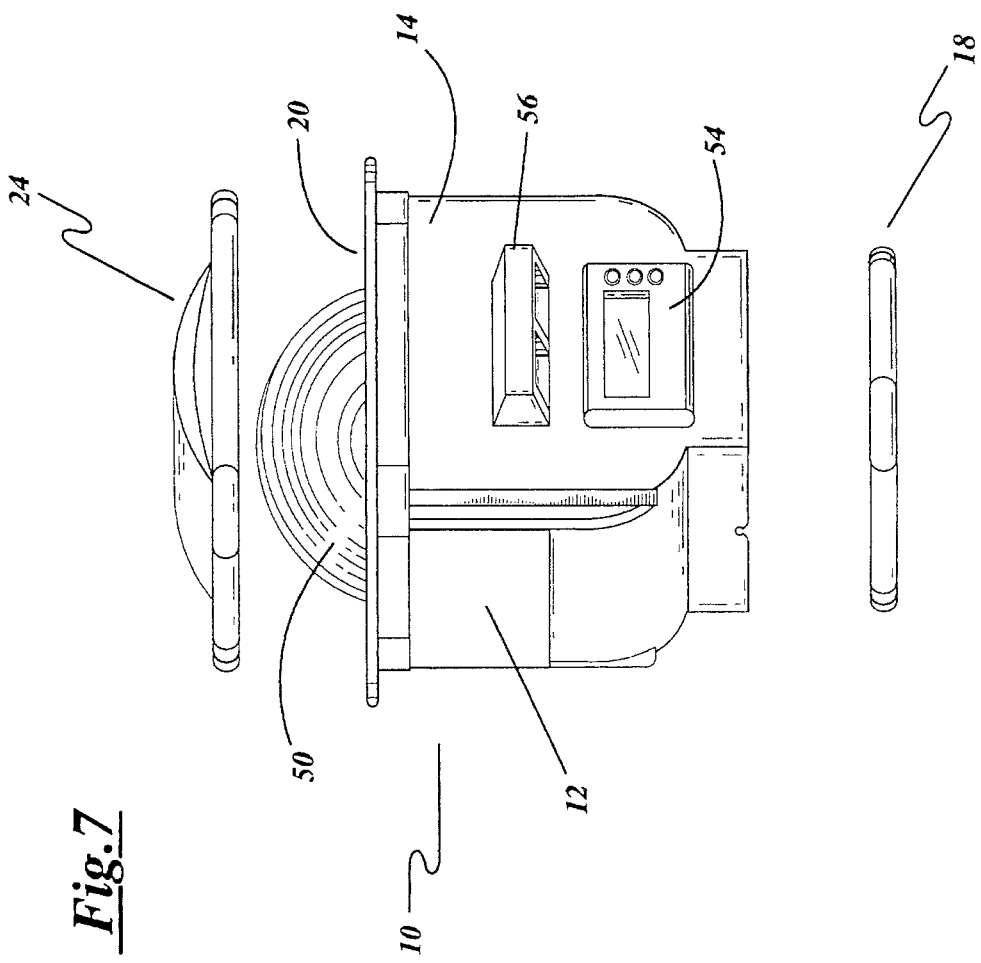
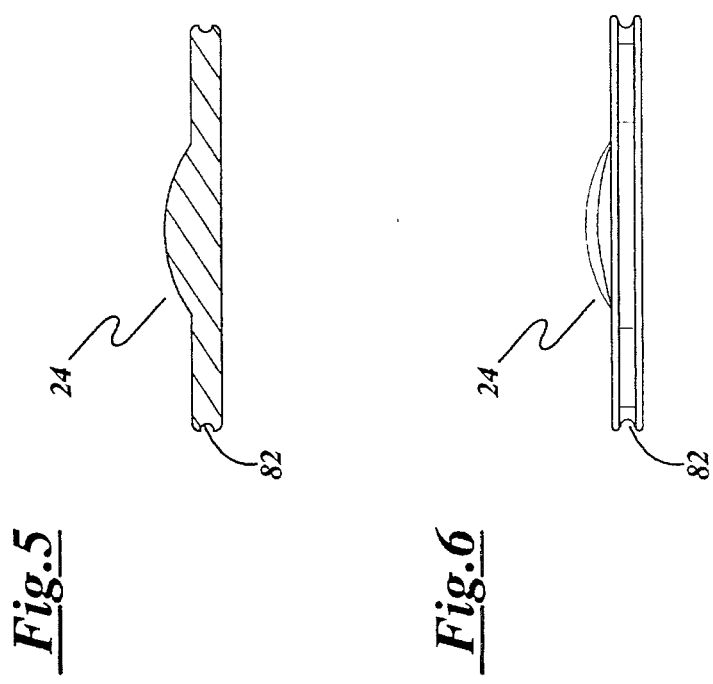

REINFORCED SEMICONDUCTOR WAFER HOLDER

BACKGROUND OF THE INVENTION

I. Field of the Invention

This invention relates generally to semiconductor wafer holders used in the storage, transportation and processing of semiconductor wafers. More particularly, it relates to a hermetically sealable purgable cassette used for containing semiconductor wafers during processing, transportation and storage having recess-forming pairs for supporting semiconductor wafers. The cassette of the present invention helps reduce warpage during the plastic injection molding and cooling process that is used in making the cassette, and during use of the cassette.

II. Discussion of the Prior Art

Production of semiconductor wafers requires an extremely clean environment. The presence of any small particles, vapors or static discharge in the environment is damaging to the production of semiconductors, and the wafers themselves. In an effort to combat airborne particle problems, various techniques are in use today.

The most common technique in use today, is to provide a cassette for holding the semiconductor wafers which meet Semiconductor Equipment and Materials International (SEMI) standards. The SEMI standards recite specifications with the purpose of defining interchangeable, standardized containers suitable for standardized processing cassettes. A standardized mechanical interface (SMIF) system has been proposed by Hewlett-Packard Company as disclosed in U.S. Pat. Nos. 4,532,970 and 4,534,389 with the purpose of reducing particle fluxes on the semiconductor wafers.

In the SMIF system, a cassette meeting SEMI standards is placed inside a clean Work In Process (WIP) box or pod. The SMIF pod or box keeps the cassette and wafers free of particles during transportation and storage. The pod or box also isolates the wafers from the operator. The semiconductor wafer cassette, the wafers, and the inside of the box or pod must all be free of particles damaging to the semiconductor manufacturing process.

The SMIF pods or boxes are used during processing in either a general clean room environment or a clean mini-environment (i.e.: under a canopy). Once in a clean environment, the SMIF boxes or pods are opened for removal of the cassette and for processing of the wafers. This can be done in a clean environment without contaminating the cassette or wafers.

During the automated processing of the semiconductor wafers a robotic arm of the processing tool removes the wafers from an indexed cassette and returns the processed wafers to their proper position. To prevent damage to the semiconductor wafers, when being removed and returned to the cassette by the robotic arm, the cassette must uniformly position a plurality of wafers within the cassette according to parameters pre-programmed into the automated process tool. For example, each wafer's horizontal alignment and the wafer's tilt is pre-programmed into the automated processing tool. The robotic arm then advances to this exact location to remove or return the semiconductor wafers.

When placing wafers inside the cassette, a recess-forming pair or divider or slot-forming spacer means supports and separates the wafers a predetermined distance from each other. This distance is also known by the robotic arm. During the molding process used to make the cassette and during use of the cassette, these recess-forming pairs may warp thereby causing the wafers to tilt outside the parameters pre-programmed into the automated processing tool. To remove the wafer, the robotic arm aligns itself within the cassette according to the pre-programmed parameters. If the wafer is tilted or not in horizontal alignment, the robotic arm may crash into the wafer, thereby damaging or destroying the semiconductor wafer.

Likewise, when replacing the wafer, if the divider has warped and therefore is not in the pre-programmed position, the wafer may scrape or crash against the warped divider. This damage or destruction to the semiconductor wafers can prove costly. Therefore, there is a need for a standard acceptable cassette having dividers that do not effect wafer transfer when warpage occurs.

The warp and shrink of the recess-forming pairs may be caused by several factors including: the polymer compound used, the selected press parameters for the plastic injection mold, part design, the total volume of each recess-forming pair, the thickness of the cassette sides, and the volume of the perimeter lip. Currently, with fiber filled resins, control of warping and shrinking during the plastic injection molding process is very difficult, if not impossible. Even when running the mold press within acceptable parameters, a significant percentage of molded cassettes have warped dividers that do not fall within the tolerances necessary for the wafer processing. This results in an over abundance of warped, unacceptable cassettes in the cassette manufacturing process. The molding of unacceptable cassettes increases the total cost, and production time of the molding process. Therefore, a need exists for a cassette that is not as readily effected by the above listed warp factors during the plastic injection molding and cooling process.

To permit automated processing of the wafers, the cassette must be indexed with the process tool. An H-bar is formed on the outside of a standardized cassette, which aids in the indexing of the cassette with the process tool. However, over time the H-bar warps and does not consistently index a cassette in the same location relative to the process tool. Therefore, the H-bar is not a dependable method for attaining high repeatability in indexing the cassette to the process tool.

During automated processing, the indexing of the cassette with the process tool must be performed in a clean environment to prevent contamination. In present manufacturing systems, the SMIF pod or box must be opened and the cassette removed in such a way that requires additional process tools and steps. The increase in required steps and tools adds to the likelihood that the process tool equipment will be unable to interface with the necessary removal tools.

The increase in required steps also requires a greater cycle time to index a cassette with the process tool. Further, when using a SMIF pod or box, the loading height of the process tool equipment must be large enough to allow for the removal of the standard cassette from the box or pod. Consequently, the SMIF pods or boxes are large and heavy requiring more storage space and increasing the likelihood of carpal tunnel damage to the handlers of boxes or pods. These problems are all overcome by eliminating the need to use SMIF boxes or pods. Elimination of the boxes or pods also reduces the amount of necessary clean-up, thereby further reducing the cost of processing semiconductor wafers.

The present invention overcomes the disadvantages of the current manufacturing system by providing a hermetically sealed cassette that can be purged with an inert gas. This sealed cassette may be indexed directly onto the process tool, eliminating the following steps: opening the SMIF box or pod, lowering the pod or box door simultaneously with the cassette, and manipulating the cassette onto the process tool. The hermetically sealed cassette has one surface of a three-groove kinematic coupling to positively locate the cassette with the process tool. This coupling provides a dependable method to position the cassette relative to the process tool with a high rate of repeatability.

Further, the cassette is smaller and about 20% to 50% lighter than the SMIF box or pod. Hence, there is a reduced likelihood that handlers will suffer from carpal tunnel. The reduced size eliminates the need that loading height of the process tool equipment be large enough for the removal of the standard cassette from a SMIF box or pod. Also, the required storage, transportation, and positioning space are reduced. A tracking system provided on the outer surface of the hermetically sealed cassette allows the cassette to be tracked in an unfriendly external environment during the transportation, storage or processing of the semiconductor wafers.

The negative effects of warpage, including the increased likelihood of semiconductor wafer damage, can be eliminated by providing a unique contour to each divider or recess-forming pair. Also, the addition of exterior ribs integrally corresponding with each contoured recess-forming pair reduces warpage of the contoured recess-forming pair during the plastic injection molding and part cooling process. The contoured recess-forming pair has a volume dependent on the corresponding exterior ribs, the cassette sides thickness, the distance between each recess-forming pair, and the volume of the perimeter lip.

SUMMARY OF THE INVENTION

The purpose of the present invention is to provide a sealable, purgable, cassette that is compatible with SEMI standards, and having a reduced tendency for the recess-forming pairs (dividers, or slot-forming spacer means) to warp during the plastic injection molding process. The cassette has at least one open end, a cover with a sealing means, a means for supporting the semiconductor wafer's within the cassette, a purging means, a positive indexing means, a tracking means, and ribs extending from the exterior sides of the cassette. The cover when engaged forms a hermetic seal with the cassette. The cassette is designed to securely support semiconductor wafer's within the sealed cassette. The recess-forming pairs which support the wafers are contoured to help eliminate the negative effects of warpage of the recess-forming pairs during the plastic injection molding process. The contoured recess-forming pairs also improve the ability of a pre-programmed robotic arm to transfer the wafers in and out of an indexed cassette without damaging or destroying the semiconductor wafers. The hermetically sealed cassette allows direct indexing to semiconductor wafer processing equipment without the influence of external factors on the contents of the container. The positive indexing means provides a dependable method of indexing the cassette to the process tool. The indexing means positions the cassette relative to the process tool in a precise manner with a high rate of repeatability. When sealed, the purging means allows a small volume of inert gas to be slowly purged into the cassette, providing a clean environment for the semiconductor wafers. Tracking means are provided for tracking the cassette without the need for a clean external environment. The exterior ribs are positioned on the outer sides of the cassette and integrally correspond to contoured recess-forming pairs. The volumes of the contoured recess-forming pairs and the ribs are dependent on each others volume, the thickness of the cassette sides, the distance between each recess-forming pair, the volume of the lip forming the opening to the cassette and the cassette bottom frame. To determine volume dependency, the area of the cassette can be broken into a plurality of smaller equal segments. Likewise, each element of the cassette has a plurality of corresponding segments. Hence, the volumes in the corresponding segments of the contoured recess-forming pairs and the ribs are dependent on each others segment volume, and all adjacent segment volumes. The volume dependency of each segment shifts the center of mass for each segment of the sidewall towards the center of the sidewall. This shift in the center of mass for each segment further prevents the contoured recess-forming pairs from warping during the plastic injection molding and cooling process.

It is accordingly a principal object of the present invention to provide a hermetically sealed cassette which meets SEMI standards.

Another object of the present invention is to provide a simple flexible, low-cost, non-obtrusive cassette for semiconductor wafers, that allows isolation control.

Another object of the present invention is to provide a purgable cassette.

Another object of the present invention is to provide a cassette that can be directly indexed with a process tool in a mini-clean environment reducing the cycle time to process a semiconductor wafers.

Another object of the present invention is to provide a directly indexable cassette having a means to positively index the cassette relative to the process tool with a high rate of repeatability.

Still another object of the present invention is to provide a cassette that can reduce the number of process tools and steps for semiconductor wafer processing.

A further object of the present invention is to provide a cassette that enhances reliability during wafer processing by eliminating the need for SMIF boxes or pods, large clean rooms, and the additional processing steps that the use of boxes or pods requires.

Yet another object of the present invention is to provide a cassette that reduces the overall weight and size of the package used to store and transport the semiconductor wafers in a clean environment.

Another object of the present invention is to provide a cassette with a tracking system that can be implemented outside of a clean environment.

Still a further object of the present invention is to provide a cassette which improves the ability of the robotic arm of automated processing equipment to remove and replace semiconductor wafers from a cassette.

Another object of the present invention is to provide a semiconductor wafer cassette that decreases the likelihood of damage or destruction to the wafer by the robotic arm during the wafer insertion or extraction process.

Another object of the present invention is to provide a cassette having recess-forming pairs (slot-forming spacer means or divider) for supporting and dividing semiconductor wafers that do not warp as readily during the plastic injection molding and cooling process.

Another object of the present invention is to shift the center of mass of the cassette sidewall towards the center of the sidewall cross-section.

Yet another object of the present invention is to provide a cassette having exterior ribs that help prevent the recess-forming pairs from warping during the plastic injection molding and cooling process.

These and other objects, as well as the features and advantages of the present invention, will be readily apparent to those skilled in the art from a review of the following detailed descriptions of the preferred embodiment in conjunction with the accompanying drawings and claims.

DESCRIPTION OF THE DRAWINGS

FIG. 3 is a sectional view of the cassette of the type shown in FIG. 2, showing the inner side of the H-bar, with the alternate preferred indexing spheres shown.

FIG. 3-A is a cross-sectional view through line A—A of FIG. 3.

FIG. 4 is a sectional view of the cassette of the type shown in FIG. 1, with the cover and optional bottom engaged and a wafer positioned within the cassette.

FIG. 4-B is a cross-sectional view through line B—B of FIG. 4, with the cover and bottom elevated from the cassette.

FIG. 5 is a sectional end view of the cover of the type shown in FIG. 1, with the seal removed.

FIG. 6 is an end view of the cover of the type shown in FIG. 1, with the seal removed.

FIG. 7 is a perspective view of the cassette, showing the cover and optional bottom aligned with the cassette, a semi conductor wafer partially extending into the cassette and the optional handle and tracking means, affixed to an end of the cassette.

DETAILED DESCRIPTION OF THE PREFERRED EMBODIMENT

Figure 1:
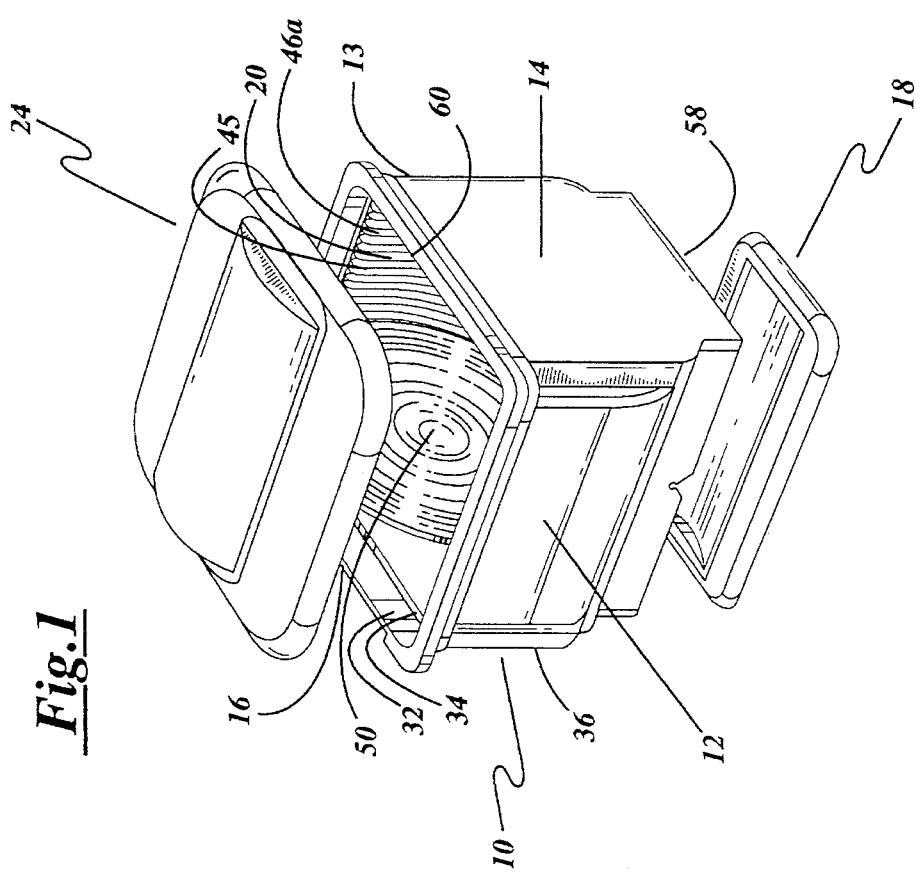
FIG. 1 is a perspective view of the cassette with the cover and optional bottom aligned with the cassette.

Referring first to FIG. 1, there is indicated generally the sealable semiconductor wafer cassette 10, a cassette cover 24, a wafer 50, and an optional cassette bottom door 18.

The semiconductor wafer cassette 10 has a pair of opposing side walls 12 and 13, a pair of end walls 14 and 16, an open top 20, and an optional open bottom 58. The cassette cover 24 is designed to close and seal the open top 20. The bottom door 18 is designed to close and seal the optional open bottom 58.

Figure 2:
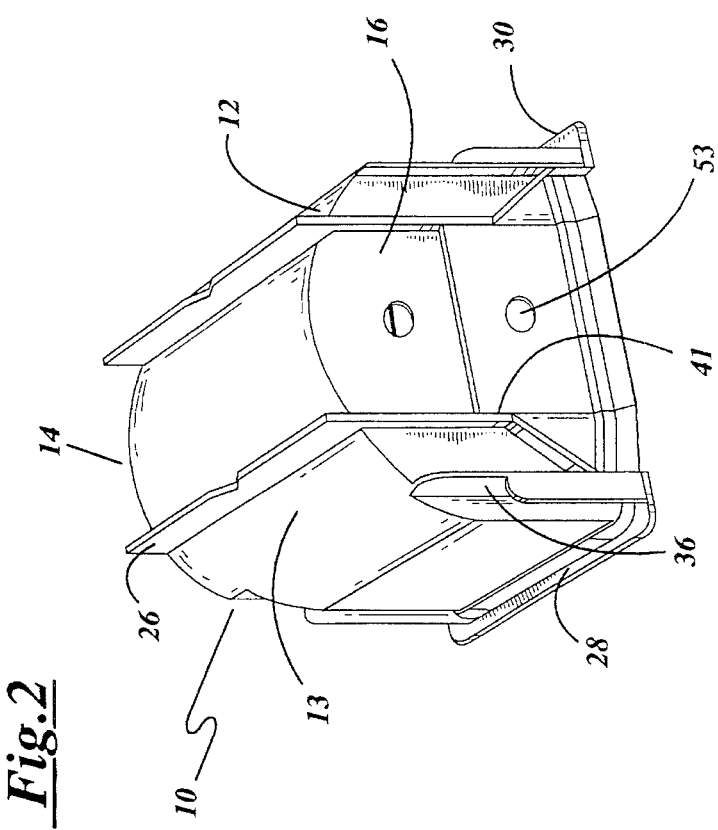
FIG. 2 is a perspective view of the semi-standard cassette showing an enclosed bottom and the H-bar side.
Figure 9:
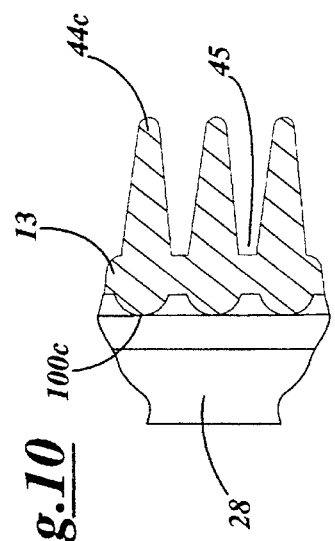
FIG. 9 is a cross-sectional view through line 9—9 of FIG. 8.
Figure 10:
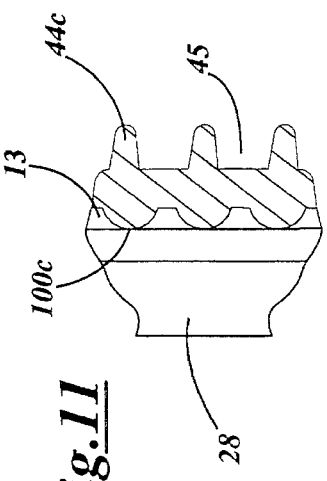
FIG. 10 is a cross-sectional view through line 10—10 of FIG. 8.
Figure 11:
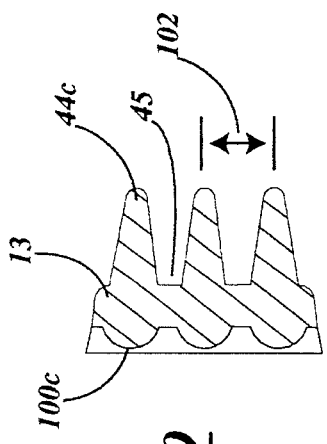
FIG. 11 is a cross-sectional view through line 11—11 of FIG. 8.

Referring to FIGS. 2 and 3 the curved semiconductor wafer supporting sidewalls 12 and 13 extend downward from the two opposing perimeter lip edges 28 and 30 to the cassette bottom frame 26. On the inner surface of the curved semiconductor wafer supporting side walls 12 and 13 are a plurality of recess-forming pairs (dividers or slot-forming spacer means) 44a–t and 46a–t shaped like saw teeth with the apex of each recess-forming pair aligned on opposing interior surfaces, best shown in FIGS. 1, 3-A, 12 and 13. The apex of each recess-forming pair forms a slot 45, providing a supporting surface for the semiconductor wafers 50 in perimeter contact with the lower portion of the curved sides 12 and 13. The inside of the optional bottom door 18 may be recessed to form a continuous support surface to the wafers 50 (see FIGS. 1 and 4). The cassette may be constructed with a varying number of recess-forming pairs, of course, without deviating from the invention.

Forming the enclosed ends of the semiconductor wafer cassette 10 are the end walls 14 and 16. The end wall 14 forming an enclosed end of the semiconductor wafer cassette 10 has an optional processing handle 56 which extends relatively perpendicular to the end wall 14 and relatively parallel to the open top 20 (see FIG. 7). The cassette processing handle 56 forms a gripping surface. Also, attached to the end wall 14 is the optional cassette level tracking system 54, allowing a semiconductor wafer cassette 10 to be tracked during processing, transportation, and storage. Several types of tracking systems may be used including but not limited to: infrared encoders, radio frequency transmitters, and bar codes that interact with bar code readers.

Opposite the end wall 14 is the H-bar end 16 that forms the other enclosed end of the semiconductor wafer cassette 10 (See FIG. 2). An H-bar 41 extends from the surface of the H-bar end that allows the cassette 10 to be indexed with the processing tool. Referring to FIGS. 3 and 3-A an optional plurality of partial spheres 42 may extend from the H-bar end 16 allowing precise, consistent and reliable indexing. The optional partial spheres 42 form one surface of a three groove kinematic coupling.

A three groove kinematic coupling consists of two surfaces. Three spheres arranged to form a triangle are attached to one surface and three grooves, designed to align and engage the spheres, are formed within the other surface. The two surfaces are brought into contact. The spheres engage with the grooves, precisely orienting the two surfaces relative to the other. This coupling arrangement allows repeatability of the precise orientation on the order of the surface finish of the spheres and grooves. The preferred material for the spheres and grooves is a hard ceramic such as tungsten carbide, silicon nitride or zirconia. Of course other materials may also be used without deviating from the invention. Either the grooves or spheres may extend from the H-bar end wall 16, to form one surface of the kinematic coupling surface 42. The other surface is formed on the process tool. This arrangement allows precise orientation between the cassette and the process tool. In the alternate preferred embodiment, the partial spheres 42 of the kinematic coupling may replace the H-bar 41.

Purging bores 53 extend through the H-bar end 16 at predetermined locations. A purging means consisting of a plurality of self sealing breather filters may extend from the end wall 16 centered over the purging bores 53, allowing the sealed semiconductor wafer cassette 10 to be purged with particle-free air or an inert gas. In the preferred embodiment, a 0.02 micron filter polytetrafluoroethylene (PTFE) membrane is used. These filters may be sealed within a housing that in turn extends through and seals with the purging bore 53. Other suitable mechanisms can, of course, be used without deviating from the invention. The purging bores 53, optional handle 56, purging means, and tracking means 54 may alternatively be attached to the cover 24 or bottom 18 of the semiconductor wafer cassette without deviating from the invention.

Referring again to FIGS. 1 and 3, the open top 20 is formed by a perimeter lip 60, a perimeter shoulder 32 that extends perpendicularly downward from an inner edge of lip 60, and a ledge 34 that extends perpendicularly inward from the perimeter shoulder 32. The perimeter shoulder 32 and ledge 34 forms a first sealing means (see FIG. 4). The perimeter lip 60 provides a support surface for stacking an inverted cassette that is compatible with SEMI standards.

Referring to FIGS. 4, 4-B, 5, and 6 the cassette cover 24 is designed to close and seal the open top 20. Recessed around the perimeter of the cover 24 is a groove 82 that engages with a seal 23. The seal 23, preferably made of collapsible elastomer, forms a second sealing means. Of course the seal 23 may be made of other acceptable materials such as plastic or rubber without deviating from the invention. When engaged, the cover 24 rests on the cassette perimeter ledge 34. Engaging the cover 24 with the semiconductor wafer cassette open end 20 engages the first and second sealing means creating a hermetic seal.

Without limitation, the cover may be constructed with a thickness about the same as the perimeter shoulder 32 so that when the cover 24 engages with the cassette 10, a relatively flat top surface is formed. The cover may also have a means for supporting the semiconductor wafers. This means for support may be positioned to align with the apex of each recess-forming pair when the cover is engaged with the container. These supports would prevent movement of the wafer during transportation. The cover may be constructed to engage with other surfaces of the cassette, while still forming a hermetic seal without deviating from the invention.

The present invention may be constructed with an enclosed bottom or with an open sealable bottom 58. In a cassette 10 with an open sealable bottom 58, cassette bottom inner shoulder 66 extends around the inside of the optional cassette bottom frame 26, forming a third sealing surface. The optional bottom door 18 has a seal 23 extending around the perimeter, forming a fourth sealing surface. When the bottom door 18 is engaged with the semiconductor wafer cassette bottom inner shoulder 66, a hermetic seal is created between the third and fourth sealing means. When engaged, the bottom 18 rests on the cassette bottom perimeter ledge 80.

Best shown in FIGS. 1 and 2 are four vertical edges 36 that form the corners of the semiconductor wafer cassette 10, providing rigidity and support to the cassette. The vertical edges 36 extend upward from the lower portion of each end of the curved sides 12 to the perimeter ledge 34.

Figure 14:
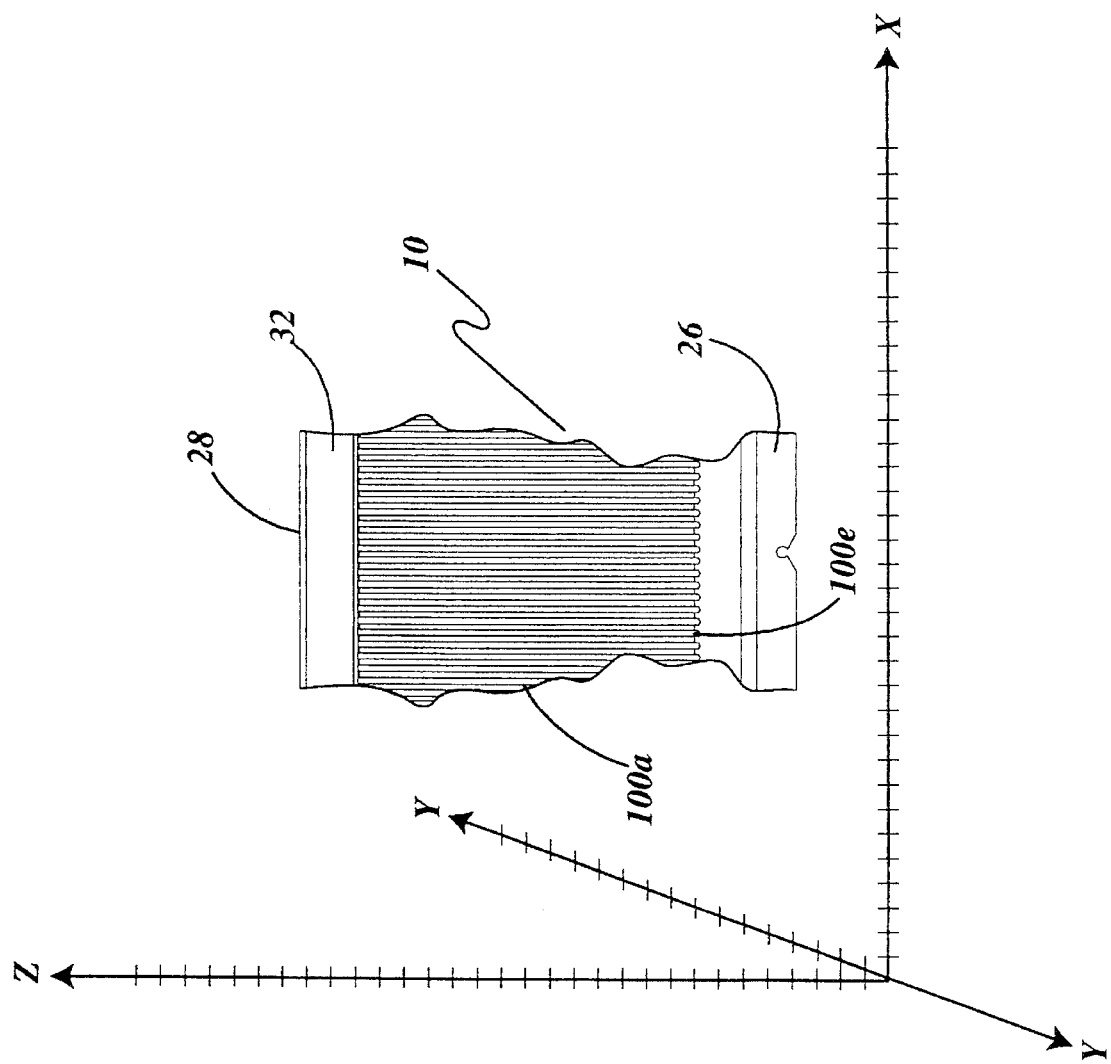
FIG. 14 is a partial side elevational view of a cassette of the type shown in FIG. 8, showing the exterior ribs extending from the cassette side, with the cassette being aligned with a three dimensional grid.

In the alternate preferred embodiment, shown in FIGS. 8–14, exterior ribs 100a–t extend outwardly from the curved semiconductor wafer supporting sidewalls 12 and 13 (see FIG. 14). The exterior ribs 100a–t extend downward from the two opposing perimeter lip edges 28 and 30 to the cassette bottom frame 26. Each exterior rib corresponds to a recess-forming pair (divider or slot forming spacer means) 44a–t and 46a–t. The exterior ribs 100a–t are integrally positioned directly opposite each recess-forming pair on the exterior surface of the sidewalls 12 and 13 (see FIGS. 9–11). The exterior ribs 100a–t are integrally positioned to help prevent each individual recess-forming pair from warping during the plastic injection molding process. For explanatory and comparative purposes, the cassette may be positioned over a three dimensional grid. The area of the cassette can be broken into a plurality of smaller equal segments corresponding to the grid. Hence, each element of the cassette has a plurality of corresponding segments. Further, each corresponding segment has a volume associated to it. The segmented volumes of different elements (the contoured recess-forming pairs, the perimeter lip, the side walls, the exterior ribs and the cassette bottom frame) of the cassette 10 may be compared (see FIG. 13).

The overall size of each exterior rib 100a–t is dependent on the combined total volume of: each recess-forming pair 44a–t and 46a–t, the sidewall 12 and 13 between each recess forming pair, the perimeter lip 28 and 30, the cassette bottom frame 26 and the particular polymer compound used. As the combined total volume increases, the overall size of each exterior rib must also be increased. Each segment of the ribs 100a–t positioned on the grid may be proportionately adjusted as a function of the increase or decrease in the total volume of the adjacent segments of the sidewall, recess-forming pair, cassette bottom frame, and perimeter lip. By proportionately adjusting the volume of each segment of the rib, the center of mass for the combination of the ribs volume and all the surrounding adjacent segments is shifted towards the width center of the sidewall. This shift in center of mass helps prevent warpage.

Therefore, the addition of the exterior ribs 100a–t, together with the proportionate adjustment of volumes, helps prevent the recess-forming pairs 44a–t and 46a–t from warping during the plastic injection molding and cooling process. A wafer placed in the slot 45 of a warped recess-forming pair will have a wafer tilt. This wafer tilt increases the likelihood of the robotic arm of the automated processing tool to either damage or destroy the wafer. Hence, the warped forming pair renders the cassette useless. As a result of the addition of the exterior ribs 100a–t, wafer tilt is reduced.

To further prevent the recess-forming pairs from warping during the plastic injection molding process the recess-forming pairs 44a–t and 46a–t may be contoured without deviating from SEMI standards. The recess-forming pairs 44a–t and 46a–t are contoured three dimensionally such that the volume of a segment of the recess-forming pair is reduced when the total combined volume of all adjacent segments increases (see FIGS. 8 and 13). For example, the volume of each recess-forming pair segment decreases the closer the recess-forming pair segment is to the perimeter lip 28 (the top portion of the recess-forming pair) or the cassette bottom frame 26 (the bottom portion of the recess-forming pair) because the total combined volumes of all adjacent segments increases (see FIGS. 8–13). This modification to the recess-forming pairs also shifts the center of mass of sidewall 12 and 13 and all adjacent segments towards the center of the sidewalls width.

Figure 8:
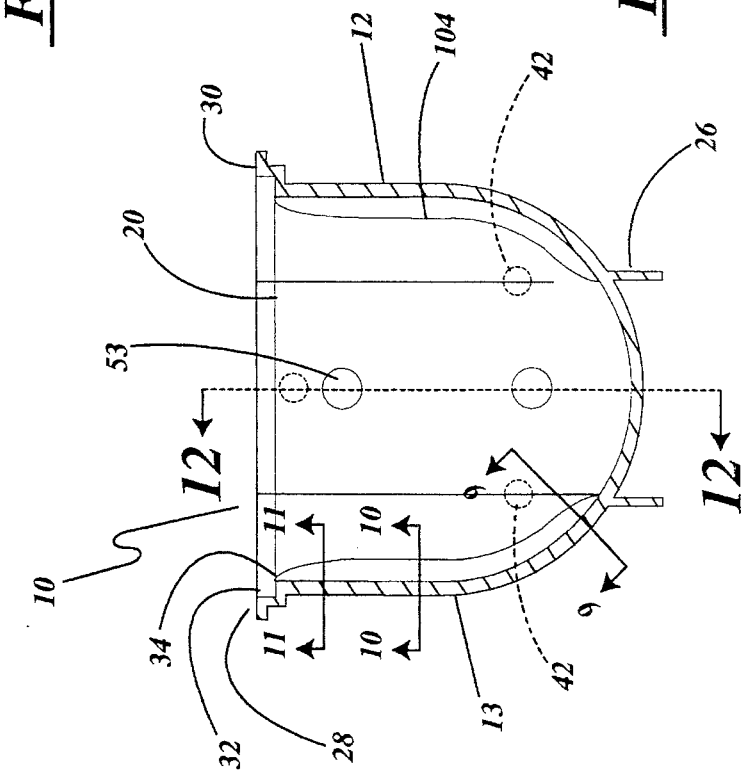
FIG. 8 is a sectional view of the alternate preferred embodiment of the cassette, showing the inner side of the H-bar, the contoured recess-forming pairs, and with the alternate preferred indexing spheres shown.
Figure 13:
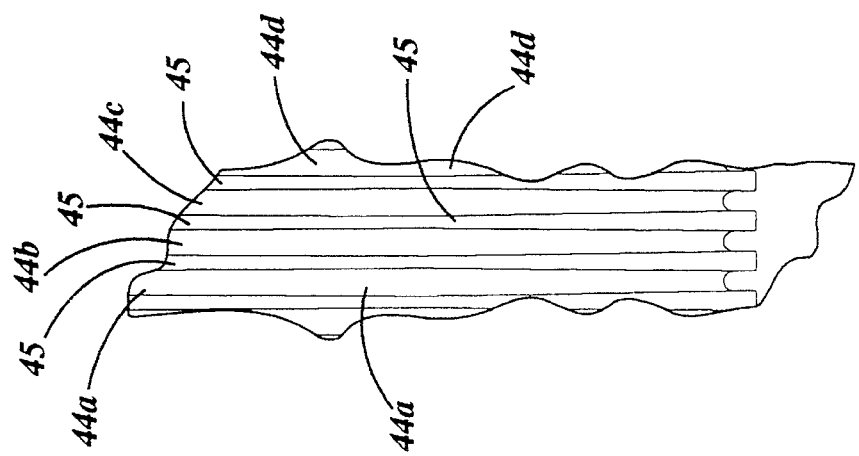
FIG. 13 is a greatly enlarged section, showing the recess forming pairs (dividers or slot-forming spacer means) and slots, of the view in FIG. 12.
Figure 12:
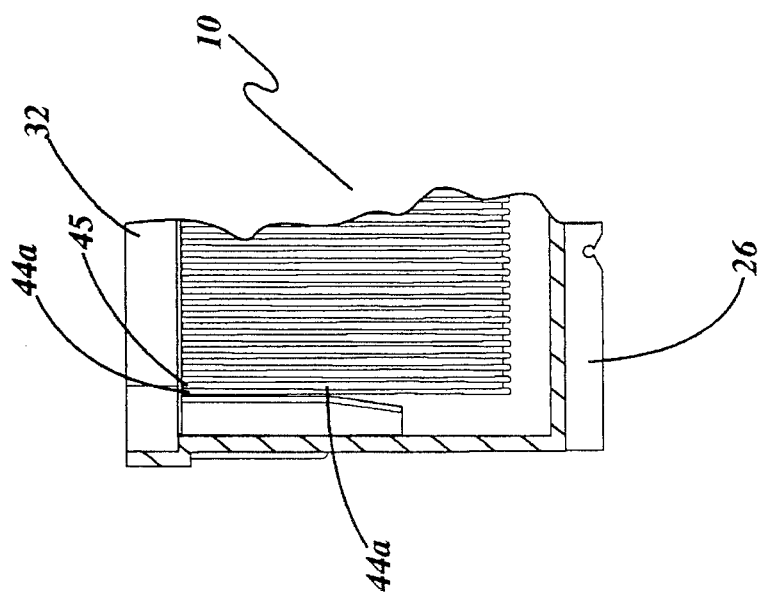
FIG. 12 is a cross-sectional view through line 12—12 of FIG. 8.

To conform to standards, the segments of the recess-forming pairs 44a–t and 46a–t, closest to the horizontal axis of the semiconductor wafer (the middle portion of the recess forming pair), must remain constant resulting in a region of segments that form a relatively flat portion 104 of the recess-forming pairs (see FIG. 8). In the alternate preferred embodiment the overall contour of each recess-forming pair has the general features of a modified ellipsoid with a flat region through its middle portions (see FIGS. 8 and 13).

The decreased volume in the recess-forming pair segments closest to the perimeter lips 28 and 30, further allows a robotic arm of the processing tool easier access to the semiconductor wafers. The decreased volume of the recess-forming pair segments nearer to the cassette bottom frame 26 increases the support surface for the wafer. An increased support surface towards the bottom of the cassette provides additional relief for the wafer. The increased support surface also reduces the likelihood that a robotic arm inserting a wafer completely into the slot 45 will damage or destroy the wafer.

Having described the constructional features of the sealable, purgable semiconductor wafer cassette 10, the mode of use will now be discussed. With a sealed clean cassette containing semiconductor wafers, the operator of the wafer processing equipment indexes the sealed semiconductor wafer cassette 10 directly onto the processing tool. To control the particles on the exterior surface of the integrated cassette 10, the processing equipment should provide a mini-environment that allows a slight overpressure within the mini-environment to prevent the exterior environment from entering into the clean mini-environment. The mini-environment must also provide good air flow to the processing tool.

The cassette 10 may be indexed horizontally or vertically, depending on the preferred cassette orientation. Then, a processing tool with a suction and vacuum capability aligns and engages the cassette cover 24. The hermetic seal collapses allowing the process tool to remove the cover 24. Next, all the desired processes may be performed on the semiconductor wafers within the cassette. After all the desired processes have been performed, the cover 24 is then resealed by engaging the cover 24 with the cassette's perimeter ledge 34, discontinuing the vacuum and disengaging the suction. A hermetic seal is formed between the perimeter shoulder 32, the ledge 34 and the cover's seal 23.

The cassette may then be transported to other process stations, stored or otherwise transported. During storage, the cassette may be purged with an inert gas utilizing two 0.02 micron filter PTFE membranes providing a clean environment for semiconductor wafers 50. When the active purge is removed, the sealed cassette 10 will maintain the inert gas purge for several hours. This method allows the semiconductor wafers to be safely stored and transported in an unfriendly external environment. Also, during processing, transportation or storage, the optional tracking system 54 may be used to track the cassette in an external environment. The optional handle 56 on the end wall 14 of the cassette 10 facilitates loading and unloading a cassette into process equipment and storage areas.

This invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed:

1. A cassette for securely containing semiconductor wafers comprising:

a container having spaced parallel solid sides having opposed interior surfaces, an open top end, and including a lip extending peripherally around said open top end, a plurality of slot-forming spacer means aligned on said opposing interior surfaces forming a plurality of aligned parallel slots to support semiconductor wafers, said slot-forming spacer means are configured to facilitate automated insertion and removal of wafers supported in said slots wherein a top portion of each slot-forming spacer means near the open top end is narrower in width than, and extends from one of said interior surfaces less than, a relatively lower, middle portion of the slot-forming spacer means.

2. The cassette as recited in claim 1 further comprising exterior ribs extending downwardly from said lip and protruding outwardly from opposing exterior surfaces of said solid sides of said container to a cassette bottom frame, whereby each said exterior rib is opposite and aligned with a said slot-forming spacer means to inhibit warpage of each of said slot-forming spacer means.

3. A cassette for securely containing semiconductor wafers comprising:

a container having spaced parallel solid sides having opposed interior surfaces, an open top end, and including a lip extending peripherally around said open top end, a plurality of dividers, each protruding inwardly to an apex, on said opposing interior surfaces and forming a plurality of parallel slots to support semiconductor wafers, and exterior ribs extending downwardly from said lip to a cassette bottom, each rib protruding outwardly to an apex from an exterior surface of said solid sides of said container, whereby the apex of each of said exterior ribs is substantially aligned with the apex of one of said dividers in a direction perpendicular to the surfaces to inhibit warpage of each of said dividers.

4. The cassette as recited in claim 3 in which said dividers are contoured to allow a robotic arm of an automated processing equipment easier access to semiconductor wafers supported by said dividers wherein a top portion of each divider near the open top end is narrower in width than, and extends from a said interior surface less than a relatively lower, middle portion of the divider.

5. The cassette as recited in claim 4 wherein a bottom portion of each divider near the cassette bottom frame is narrower in width than, and extends from said interior surface less than said middle portion of the divider.

6. The cassette as recited in claim 3 in which said dividers are contoured such that said slots do not effect semiconductor wafer transfer when warpage of said dividers occurs wherein a top portion of each divider near the open top end is narrower in width than, and extends from a said interior surface less than, a relatively lower, middle portion of the divider, and a bottom portion of the divider near the cassette bottom frame is narrower in width than, and extends from said interior surface less than said middle portion of the divider.

7. The cassette as recited in claim 3 in which each exterior rib is further comprised such that a segment of said exterior rib is proportionate to a combined volume of surrounding adjacent segments of said solid sides, said dividers, said lip and said cassette bottom frame in order to shift a center of mass of said rib segment and all of said surrounding adjacent segments towards a center of a corresponding segment of said solid sides.

8. A cassette for securely containing semiconductor wafers comprising:

a container having spaced parallel sides having opposing interior surfaces, an open top end, and including a lip extending peripherally around said open top end, a plurality of recess-forming pairs of dividers aligned on said opposing interior surfaces forming a plurality of parallel slots to support semiconductor wafers, and exterior ribs extending downwardly from said lip and protruding outwardly from opposing exterior surfaces of said sides of said container to a cassette bottom frame, whereby each exterior rib is further comprised such that a segment of said exterior rib is proportionate to a combined volume of surrounding adjacent segments of said sides, said dividers, said lip and said cassette bottom frame in order to shift a center of mass of said rib segment and all of said surrounding adjacent segments towards a center of a corresponding segment of said sides.

9. The cassette as recited in claim 8 in which said recess-forming pairs are contoured to allow a robotic arm of an automated processing equipment easier access to semiconductor wafers supported by said recess-forming pairs wherein a top portion of each divider near the open top end is narrower in width than, and extends from a said interior surface less than a relatively lower, middle portion of said divider.

10. The cassette as recited in claim 9, wherein a bottom portion of said divider near the cassette bottom frame is narrower in width than, and extends from said interior surface less than said middle portion of said divider.

* * * * *